(12) United States Patent
Kim

(10) Patent No.: US 6,964,592 B2
(45) Date of Patent: Nov. 15, 2005

(54) METHOD OF FABRICATING ORGANIC ELECTROLUMINESCENCE DISPLAY DEVICE

(75) Inventor: Jin-Ook Kim, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 139 days.

(21) Appl. No.: 10/330,255

(22) Filed: Dec. 30, 2002

(65) Prior Publication Data

US 2003/0139112 A1    Jul. 24, 2003

(30) Foreign Application Priority Data

Dec. 29, 2001   (KR) ...................... 10-2001-0088542

(51) Int. Cl.[7] ............................................. H05B 33/10
(52) U.S. Cl. ............................ 445/24; 427/66; 445/14
(58) Field of Search ............................. 445/14, 24, 25; 427/66

(56) References Cited

U.S. PATENT DOCUMENTS

| | | | |
|---|---|---|---|
| 5,902,688 A | * | 5/1999 | Antoniadis et al. ........... 427/66 |
| 5,972,419 A | * | 10/1999 | Roitman ....................... 427/66 |
| 6,153,254 A | * | 11/2000 | Young et al. .................. 427/66 |
| 6,592,933 B2 | * | 7/2003 | Himeshima et al. .......... 427/66 |
| 6,827,622 B2 | * | 12/2004 | Yamada et al. ............... 445/24 |
| 2003/0017258 A1 | * | 1/2003 | Yamada et al. ............... 427/66 |
| 2004/0037949 A1 | * | 2/2004 | Wright ......................... 427/66 |

FOREIGN PATENT DOCUMENTS

KR          2004015505 A  *  2/2004  .......... H05B 33/04

* cited by examiner

Primary Examiner—Mariceli Santiago
(74) Attorney, Agent, or Firm—Morgan Lewis & Bockius LLP

(57) ABSTRACT

A method of fabricating an organic electroluminescence display device includes the steps of forming a hole injection layer on a substrate; positioning a mold supporter over the hole injection layer, the mold supporter having a mold on a surface thereof disposed toward the hole injection layer, the mold having an opening; adhering the mold onto the hole injection layer; forming a hole transporting layer in the opening of the mold on the hole injection layer; separating the mold from the hole injection layer such that the hole transporting layer remains on the hole injection layer; forming an emissive layer on the hole transporting layer; forming an electron transporting layer on the emissive layer; and forming an electron injection layer on the electron transporting layer.

19 Claims, 4 Drawing Sheets

METHOD OF FABRICATING ORGANIC ELECTROLUMINESCENCE DISPLAY DEVICE

The present application claims the benefit of Korean Patent Application No. P2001-088542 filed in Korea on Dec. 29, 2001, which is hereby incorporated by reference.

BACKGROUND OF THE INVENTION

1. Field of the Invention

The present invention relates to an electroluminescence display device, and more particularly, to a method of fabricating an organic electroluminescence display device.

2. Discussion of the Related Art

Cathode ray tube displays have been widely used as display devices for televisions and computer monitors. However, cathode ray tubes have large size, large weight, and high driving voltage. Therefore, flat panel displays—which are thin, light weight, and low in power consumption—have been in demand. Such flat panel displays include liquid crystal display devices, plasma display panel devices, field emission display devices, and electroluminescence display devices.

The electroluminescence display device may be categorized into inorganic electroluminescence display devices and organic electroluminescence display devices depending upon the source material for exciting carriers. Organic electroluminescence display devices have drawn considerable attention due to their high brightness, low driving voltage, and natural color images through the entire visible light range. Additionally, organic electroluminescence display devices have superior contrast ratio because of their self-luminescence. Organic electroluminescence display devices can easily display moving images due to its short response time of several microseconds and are not limited by a specific viewing angle. Organic electroluminescence display devices are stable at low temperatures, and their driving circuit can be easily fabricated because they are driven by a low voltage. In addition, the manufacturing process for organic electroluminescence display devices is relatively simple.

In general, an organic electroluminescence display device emits light by injecting electrons from a cathode electrode and holes from an anode electrode into an emissive layer. The electrons combine with the holes, thereby generating an exciton. The exciton then transitions from an excited state to a ground state to emit light. Since its luminous mechanism is similar to a light emitting diode, the organic electroluminescence display device may be called an organic light emitting diode (OLED).

FIG. 1 shows a band diagram of a related art organic electroluminescence display device. As shown in FIG. 1, the related art organic electroluminescence display device includes an anode electrode 1, a cathode electrode 7, a hole transporting layer 3, an emissive layer 4, and an electron transporting layer 5 disposed between the anode electrode 1 and the cathode electrode 7. The related art organic electroluminescence display device further includes a hole injection layer 2 disposed between the anode electrode 1 and the hole transporting layer 3, and an electron injection layer 6 disposed between the cathode electrode 7 and the electron transporting layer 5. The hole and electron injection layers 2 and 6 facilitate efficient injection of holes and electrons, respectively.

The holes are injected into the emissive layer 4 through the hole injection layer 2 and the hole transporting layer 3 from the anode electrode 1. The electrons are injected into the emissive layer 4 through the electron injection layer 7 and the electron transporting layer 5 from the cathode electrode 7. Together, a hole and an electron generate an exciton 8 in the emissive layer 4. Then, light corresponding to energy between the hole and the electron is emitted from the exciton 8.

The anode electrode 1 is formed of a transparent conductive material having a relatively high work function, such as indium-tin-oxide and indium-zinc-oxide. The light from the electroluminescence display device is observed at the anode electrode 1. On the other hand, the cathode electrode 7 is formed of an opaque conductive material having a relatively low work function, such as aluminum, calcium, and aluminum alloy.

In the related art organic electroluminescence display device, the hole transporting layer 3 is generally formed by spin coating. Here, the hole transporting layer 3 formed by spin coating is coated on the entire substrate. Thus, a process for removing unneeded portions of the hole transporting layer 3 is required. Since the hole transporting layer 3 is not photosensitive, the unneeded portions of the hole transporting layer 3 have been removed using dry ice.

FIG. 2 shows a method of patterning a hole transporting layer in the related art. In FIG. 2, a hole transporting layer 20 is formed on a substrate 10 overall. As stated above, the hole transporting layer 20 is disposed only in an image area "A" for displaying images. Therefore, a dry ice nozzle 30 having dry ice is positioned over the hole transporting layer 20 outside of the imose area "A." Accordingly, the hole transporting layer 20 outside the image area "A" is removed by exposing the hole transporting layer 20 to the dry ice. However, the hole transporting layer 20 in the image area "A" may be damaged by the dry ice. Thus, in the above method, a suction apparatus is further required to remove the dry ice around the image area "A". As a result, manufacturing costs are increased due to the suction apparatus.

SUMMARY OF THE INVENTION

Accordingly, the present invention is directed to a method of fabricating an organic electroluminescence display device that substantially obviates one or more of the problems due to limitations and disadvantages of the related art.

An object of the present invention is to provide a method of fabricating an organic electroluminescence display device that reduces the manufacturing processes and costs.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating an organic electroluminescence display device comprises the steps of forming a hole injection layer on a substrate; positions a mold supporter over the hole injection layer, the mold supporter having a mold on a surface thereof disposed toward the hole injection layer, the mold having an opening; adhering the mold onto the hole injection layer; forming a hole transporting layer in the opening of the mold on the hole injection layer; separating the mold from the hole injection layer such that the hole transporting layer remains on the hole injection layer; forming an emissive layer on the hole transporting layer; forming an electron transporting layer on the emissive layer; and forming an electron injection layer on the electron transporting layer.

In another aspect, a method of fabricating an organic electroluminescence display device comprises the steps of forming an electron injection layer on a substrate; forming an electron transporting layer on the electron injection layer; forming an emissive layer on the electron transporting layer; positions a mold supporter over the emissive layer, the mold supporter having a mold on a surface thereof disposed toward the emissive layer, the mold having an opening; adhering the mold onto the emissive layer; forming the hole transporting layer in the opening of the mold on the emissive layer; separating the mold from the emissive layer such that the hole transporting layer remains on the emissive layer; and forming a hole injection layer on the hole transporting layer.

In another aspect, a method of forming a hole transporting layer of an organic electroluminescence display device comprises the steps of positioning a mold supporter over a substrate, the mold supporter having a mold on a surface thereof disposed toward the substrate, the mold having an opening; adhering the mold onto the substrate; coating the hole transporting layer in the opening of the mold on the substrate; and separating the mold from the substrate having the hole transporting layer thereon.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
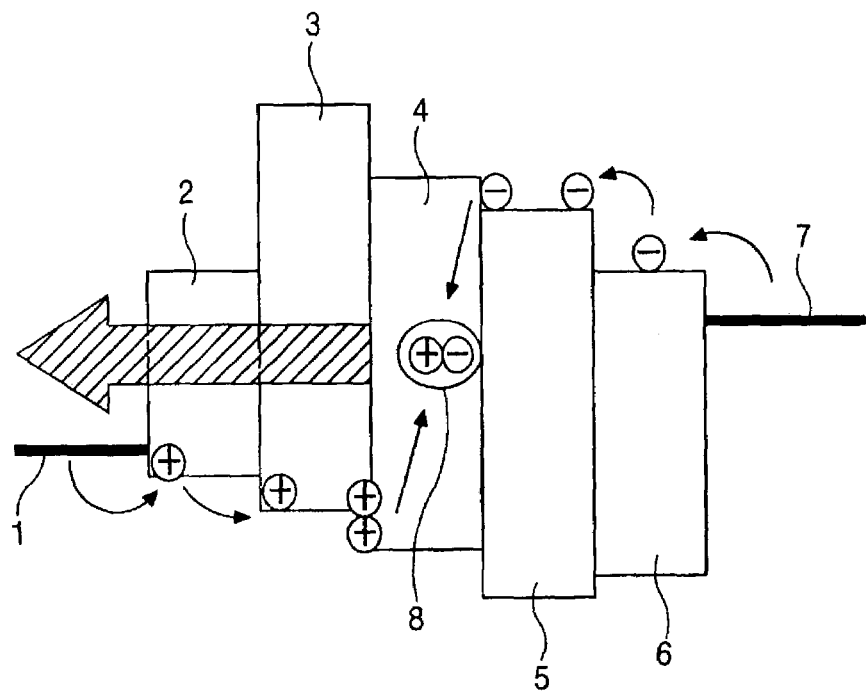
FIG. 1 is a band diagram of a related art organic electroluminescence display device.
Figure 2:
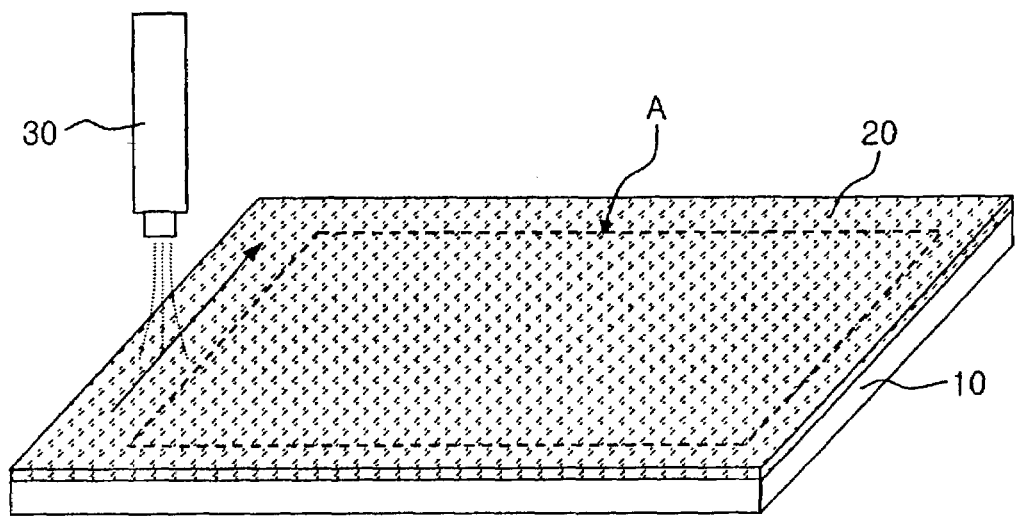
FIG. 2 is a perspective view showing a method of patterning a hole transporting layer in the related art.
Figure 3:
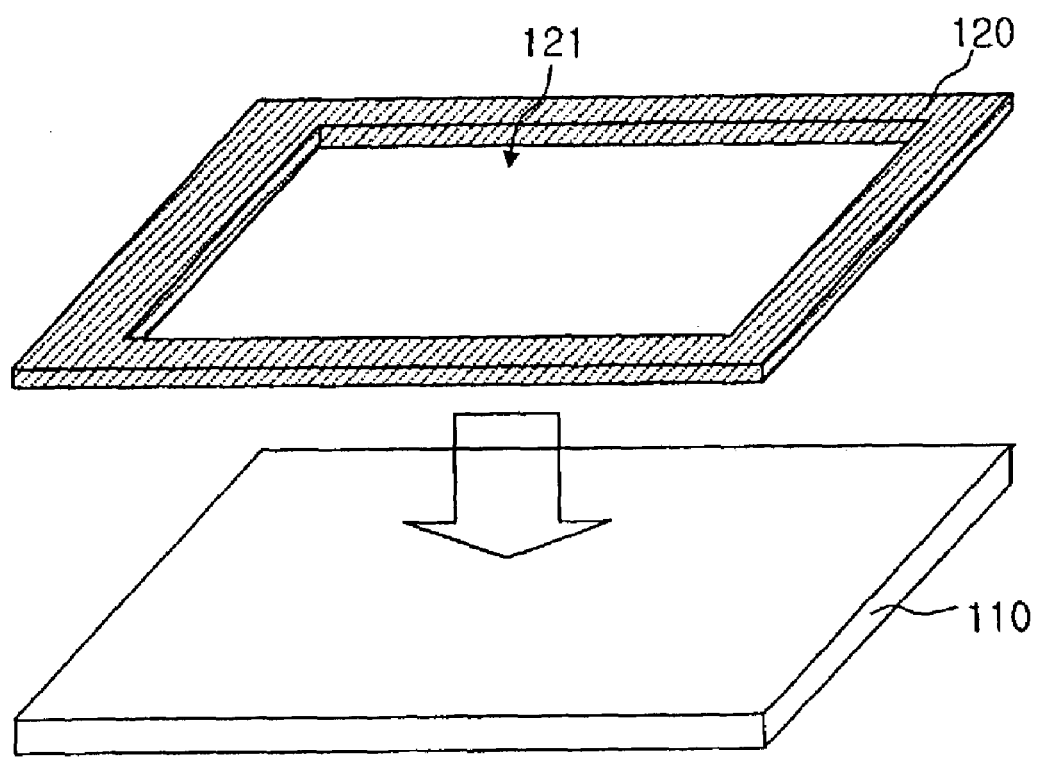
FIG. 3 is a schematic view of a mold for forming a hole transporting layer according to an embodiment of the present invention.

FIG. 3 shows a mold for forming a hole transporting layer according an embodiment of the present invention. As shown, the mold 120 has at least one opening 121 therein. The number of openings 121 varies depending on positions and shapes of the hole transporting layer to be formed. After the mold 120, which corresponds to an image area for displaying images, is adhered to a substrate 110, the hole transporting layer (not shown) is formed by a coating method, such as spin coating. Therefore, the hole transporting layer is formed only in the image area and does not require a patterning process.

The mold 120 may be made of any suitable material such as polydimethylsiloxane (PDMS). The mold 120 may include a hardening agent, for example of about 10 percent by weight, to provide a strong adhesion to the substrate 110 so that coating solution does not sink into adhered portions of the mold 120 and the substrate 110. Additionally, since the mold 120 has low wettability with respect to the coating solution, the coating solution is not coated on the mold 120. Further, while removing the mold 120 after coating the hole transporting layer, the mold 120 does not have any influence on the substrate 110.

FIGS. 4A to 4D shows a method of manufacturing a hole transporting layer according to an embodiment of the present invention. In the present invention, other layers of the organic electroluminescence display device, that is, a hole injection layer, an emissive layer, an electron transporting layer, and an electron injection layer, may be formed by any suitable method, such as those known in the art.

Figure 4A:
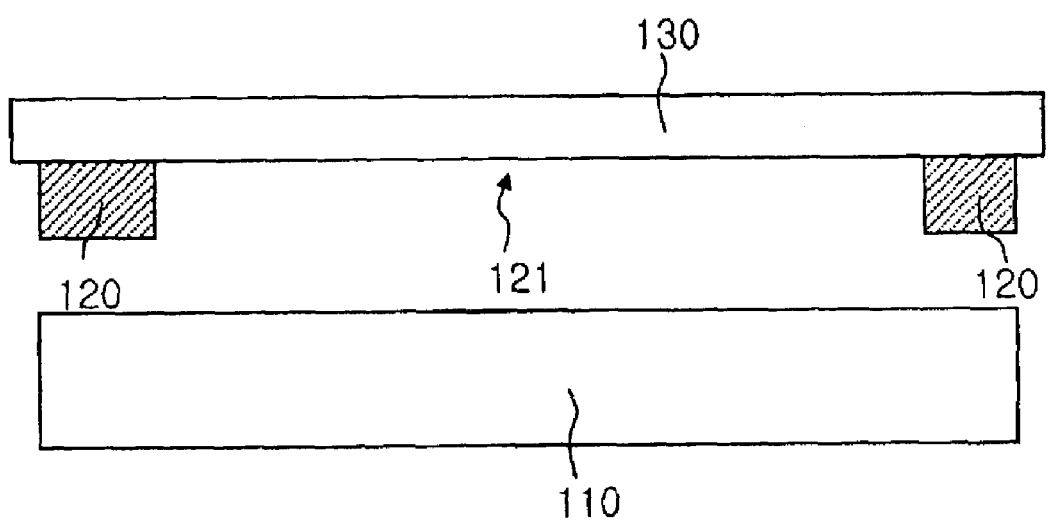
FIGS. 4A to 4D are cross-sectional views showing a method of manufacturing a hole transporting layer according to an embodiment of the present invention.

In FIG. 4A, a mold supporter 130 is positioned over a substrate 110 and faces the substrate 110. Here, a mold 120 is adhered on an inner surface of the mold supporter 130. The mold 120 has at least one opening 121.

Figure 4B:
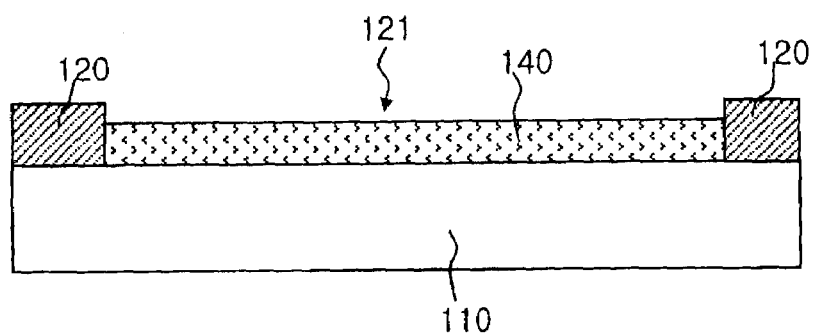

In FIG. 4B, the mold 120 is adhered onto an inner surface of the substrate 110 from the mold supporter 130 of FIG. 4A, and a hole transporting layer 140 corresponding to the opening 121 is formed on the inner surface of the substrate 110. At this time, adhesion between the mold 120 and the substrate 110 should be stronger than that between the mold 120 and the mold supporter 130. The hole transporting layer 140 may be formed by spin coating a hole transporting layer material followed by an annealing process of the hole transporting layer material. Though it is annealed at a temperature of about 250 degrees centigrade, for example, a mold 120 made of PDMS including a hardening agent of about 10 percent by weight is not damaged.

Figure 4C:
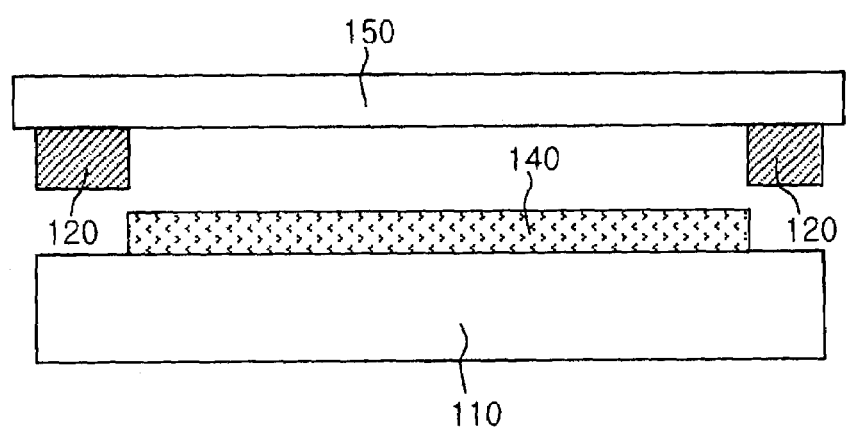

Next, in FIG. 4C, the mold 120 is adhered onto a mold removing plate 150, and is separated from the substrate 110. The mold 120 is also separated from the hole transporting layer 140. Here, adhesion between the mold 120 and the mold removing plate 150 is stronger than that between the mold 120 and the substrate 110.

Figure 4D:
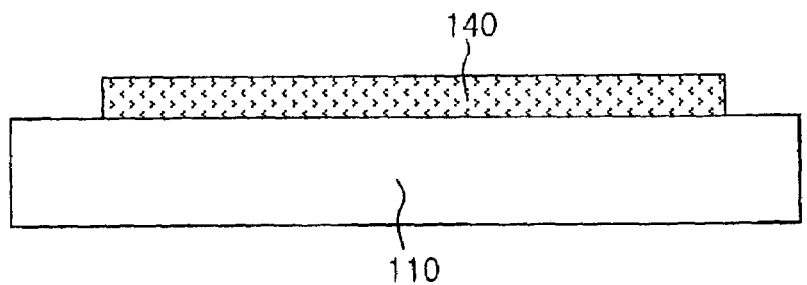

Therefore, as shown in FIG. 4D, the hole transporting layer 140 is formed only in the image area on the substrate 110 without requiring a patterning process. Moreover, in the method of the present invention, neither a suction apparatus nor dry ice is required. Thus, manufacturing processes and costs are decreased.

Figure 5:
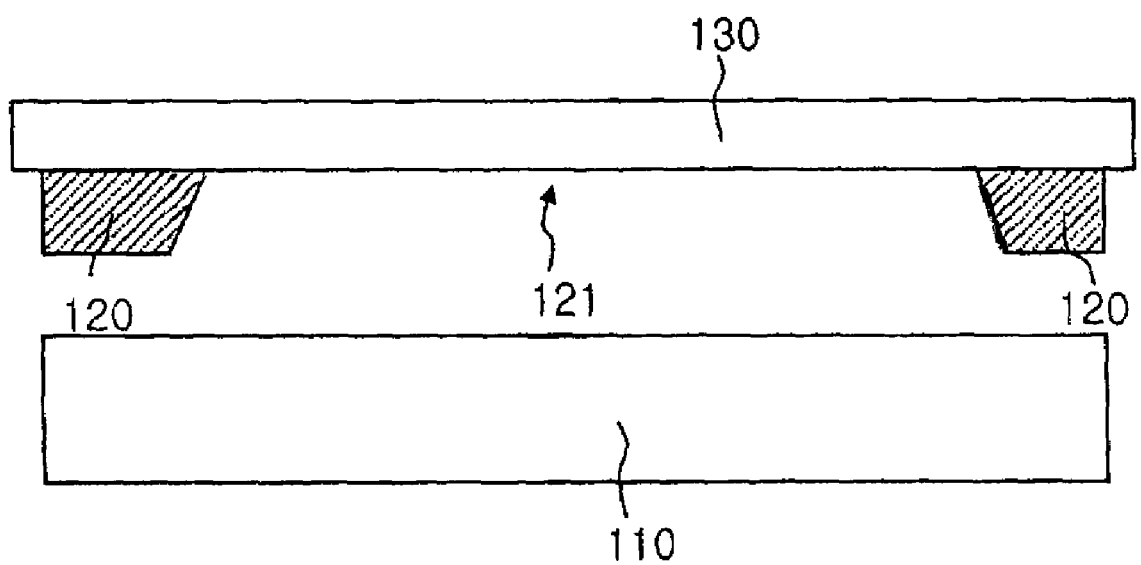
FIG. 5 is a cross-sectional view showing a mold used in a method of manufacturing a hole transporting layer according to an embodiment of the present invention.

It should be recognized that the present invention may be varied from the exemplary embodiments described above. For example, the mold 120 may have an inclined inside wall as shown in FIG. 5. Here, FIG. 5 is a cross-sectional view showing a mold used in a method of manufacturing a hole transporting layer according to an embodiment of the present invention. If an inclined inside wall is used, the coating solution can be prevented from flowing backward. While not shown, it should also be recognized that the resultant hole transporting layer 140 would have a corresponding inclined wall.

It will be apparent to those skilled in the art that various modifications and variations can be made in the organic electroluminescence display device and the method of fabricating the same of the present invention without departing from the spirit or scope of the invention. Thus, it is intended that the present invention cover the modifications and variations of this invention provided they come within the scope of the appended claims and their equivalents.

What is claimed is:

1. A method of fabricating an organic electroluminescence display device, comprising the steps of:
    forming a hole injection layer on a substrate;
    positioning a mold supporter over the hole injection layer, the mold supporter having a mold on a surface thereof disposed toward the hole injection layer, the mold having an opening;
    adhering the mold onto the hole injection layer;
    applying hole transporting layer material in the opening of the mold on the hole injection layer;
    spin coating the hole transporting layer material to form a hole transporting layer;
    separating the mold from the hole injection layer such that the hole transporting layer remains on the hole injection layer;
    forming an emissive layer on the hole transporting layer;
    forming an electron transporting layer on the emissive layer; and
    forming an electron injection layer on the electron transporting layer.

2. The method according to claim 1, wherein an adhesion between the mold and the hole injection layer is stronger than an adhesion between the mold and the mold supporter.

3. The method according to claim 1, wherein the step of separating the mold uses a mold removing plate.

4. The method according to claim 3, wherein an adhesion between the mold and the mold removing plate is stronger than the adhesion between the mold and the hole injection layer.

5. The method according to claim 1, wherein the mold includes polydimethylsiloxane.

6. The method according to claim 5, wherein the mold includes a hardening agent of about 10 percent by weight.

7. The method according to claim 1, wherein the spin coating step includes annealing the hole transporting layer material.

8. The method according to claim 1, wherein the step of applying the hole transporting layer material includes a step of a applying hole transporting layer material on a portion of the hole injection layer within the opening of the mold.

9. The method according to claim 1, wherein the mold has an inclined inside wall.

10. A method of forming a hole transporting layer of an organic electroluminescence display device, comprising the steps of:
    positioning a mold supporter over a substrate, the mold supporter having a mold on a surface thereof disposed toward the substrate, the mold having an opening;
    adhering the mold onto the substrate;
    spin coating hole transporting layer material in the opening of the mold on the substrate to form the hole transporting layer; and
    separating the mold from the substrate having the hole transporting layer thereon.

11. The method according to claim 10, wherein an adhesion between the mold and the substrate is stronger than an adhesion between the mold and the mold supporter.

12. The method according to claim 10, wherein the step of separating the mold uses a mold removing plate.

13. The method according to claim 12, wherein an adhesion between the mold and the mold removing plate is stronger than the adhesion between the mold and the substrate.

14. The method according to claim 10, wherein the mold includes polydimethylsiloxane.

15. The method according to claim 14, wherein the mold includes a hardening agent of about 10 percent by weight.

16. The method according to claim 10, wherein the spin coating step includes annealing the hole transporting layer material.

17. The method according to claim 10, wherein the spin coating step includes applying hole transporting layer material on a portion of the substrate within the opening of the mold.

18. The method according to claim 10, wherein the mold has an inclined inside wall.

19. A method of fabricating an organic electroluminescence display device, comprising the steps of:
    forming an electron injection layer on a substrate;
    forming an electron transporting layer on the electron injection layer;
    forming an emissive layer on the electron transporting layer;
    positioning a mold supporter over the emissive layer, the mold supporter having a mold on a surface thereof disposed toward the emissive layer, the mold having an opening;
    adhering the mold onto the emissive layer;
    applying hole transporting layer material in the opening of the mold on the emissive layer;
    spin coating the hole transporting layer material to form a hole transporting layer;
    separating the mold from the emissive layer such that the hole transporting layer remains on the emissive layer; and
    forming a hole injection layer on the hole transporting layer.

* * * * *